(12) United States Patent
Ishiguro (10) Patent No.: US 9,105,784 B2
(45) Date of Patent: Aug. 11, 2015

(54) SOLAR MODULE

(71) Applicant: Sanyo Electric Co., Ltd., Moriguchi, Osaka (JP)

(72) Inventor: Tasuku Ishiguro, Kobe (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 34 days.

(21) Appl. No.: 14/026,288

(22) Filed: Sep. 13, 2013

(65) Prior Publication Data

US 2014/0014160 A1    Jan. 16, 2014

Related U.S. Application Data

(63) Continuation of application No. PCT/JP2012/054894, filed on Feb. 28, 2012.

(30) Foreign Application Priority Data

Mar. 16, 2011  (JP) ................................. 2011-058332

(51) Int. Cl.
*H01L 31/054* (2014.01)
*H01L 31/052* (2014.01)
*H01L 31/048* (2014.01)

(52) U.S. Cl.
CPC .......... *H01L 31/0527* (2013.01); *H01L 31/048* (2013.01); *H01L 31/0547* (2014.12); *Y02E 10/52* (2013.01)

(58) Field of Classification Search
USPC .................................................. 136/256–259
See application file for complete search history.

(56) References Cited

U.S. PATENT DOCUMENTS

| | | | | |
|---|---|---|---|---|
| 2006/0107991 A1* | 5/2006 | Baba | ............................. | 136/244 |
| 2010/0147363 A1* | 6/2010 | Huang et al. | .................. | 136/251 |
| 2012/0138119 A1* | 6/2012 | Peng et al. | ..................... | 136/246 |

FOREIGN PATENT DOCUMENTS

| | | | |
|---|---|---|---|
| JP | 1999-307791 | * | 11/1999 |
| JP | H11-307791 A | | 11/1999 |
| JP | 2006-147984 A | | 6/2006 |
| JP | 2011-029273 | * | 2/2011 |
| JP | 2011-029273 A | | 2/2011 |

* cited by examiner

*Primary Examiner* — Jayne Mershon
(74) *Attorney, Agent, or Firm* — Marvin A. Motsenbocker; Mots Law, PLLC (57) ABSTRACT

A solar module having improved photoelectric conversion efficiency is provided. The solar module (1) is provided with a bifacial light-receiving solar cell (10), a transparent member (15), a weather-resistant member (14), and a bonding layer (13). The bonding layer (13) includes at least two media (13*b*, 13*c*) having different refractive indices. Interfaces (22, 23) are formed by at least two media (13*b*, 13*c*) and are positioned in a region unoccupied by the solar cells (10). The interfaces (22, 23) are configured such that at least some of the light that is incident on the interfaces (22, 23) in a direction (z) perpendicular to the solar module (1) is guided to the back surface (10*b*) of the solar cells (10).

5 Claims, 5 Drawing Sheets

SOLAR MODULE

CROSS-REFERENCE TO RELATED APPLICATIONS

This is a continuation of International Application PCT/JP2012/054894, with an international filing date of Feb. 28, 2012, filed by applicant, the disclosure of which is hereby incorporated by reference in its entirety.

FIELD OF THE INVENTION

The present invention relates to a solar module having a plurality of solar cells.

BACKGROUND

Figure 9:
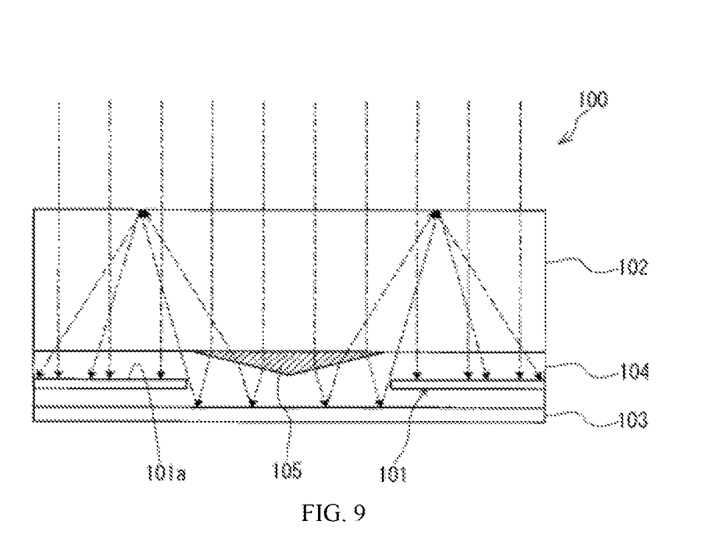
FIG. 9 is a schematic cross-sectional view of the solar module described in Patent Document 1.

The solar module 100 shown in FIG. 9 is disclosed in Patent Document 1. The solar module 100 is provided with a plurality of solar cells 101. A transparent substrate 102 is arranged on the light-receiving surface side of the solar cells 101. A back sheet 103 is arranged on the back surface side of the solar cells 101. A resin sealing layer 104 fills space between the back sheet 103 and the transparent substrate 102. A low-refraction layer 105 having a refractive index lower than that of the resin sealing layer 104 is provided between the transparent substrate 102 and the resin sealing layer 104. The low-refraction layer 105 protrudes towards the side of the back sheet 103.

Patent Document 1 describes how power generating efficiency can be increased by providing a low-refraction layer 105 to direct light incident between adjacent solar cells 101 towards the light-receiving surfaces 101a of the solar cells 101.

CITED DOCUMENTS

Patent Documents

Patent Document 1: Laid-Open Patent Publication No. 2011-29273

SUMMARY

Problem Solved by the Invention

In recent years, there has been a desire for improved photoelectric conversion efficiency in solar modules.

In view of this situation, it is an object of the present invention to provide a solar module having improved photoelectric conversion efficiency.

Means of Solving the Problem

The solar module of the present invention is provided with a bifacial light-receiving solar cell, a transparent member, a weather-resistant member, and a bonding layer. The transparent member is arranged on the light-receiving surface side of the solar cells. The weather-resistant member is arranged on the back surface of the solar cells. The bonding layer is arranged between the transparent member and the weather-resistant member. The bonding layer includes at least two media having different refractive indices. Interfaces are formed by at least two media and positioned in a region unoccupied by the solar cells. The interfaces are configured such that at least some of the light that is incident on the interfaces in a direction perpendicular to the solar module is guided to the back surface of the solar cell.

Effect of the Invention

The present invention is able to provide a solar module having improved photoelectric conversion efficiency.

DETAILED DESCRIPTION

The following is an explanation of an example of a preferred embodiment of the present invention. The following embodiments are merely examples. The present invention is not limited to the following embodiments in any way.

Further, in each of the drawings referenced in the embodiments, members having substantially the same function are denoted by the same symbols. The drawings referenced in the embodiments are also depicted schematically. The dimensional ratios of the objects depicted in the drawings may differ from those of the actual objects. The dimensional ratios of objects may also vary between drawings. The specific dimensional ratios of the objects should be determined with reference to the following explanation.

1st Embodiment

Figure 1:
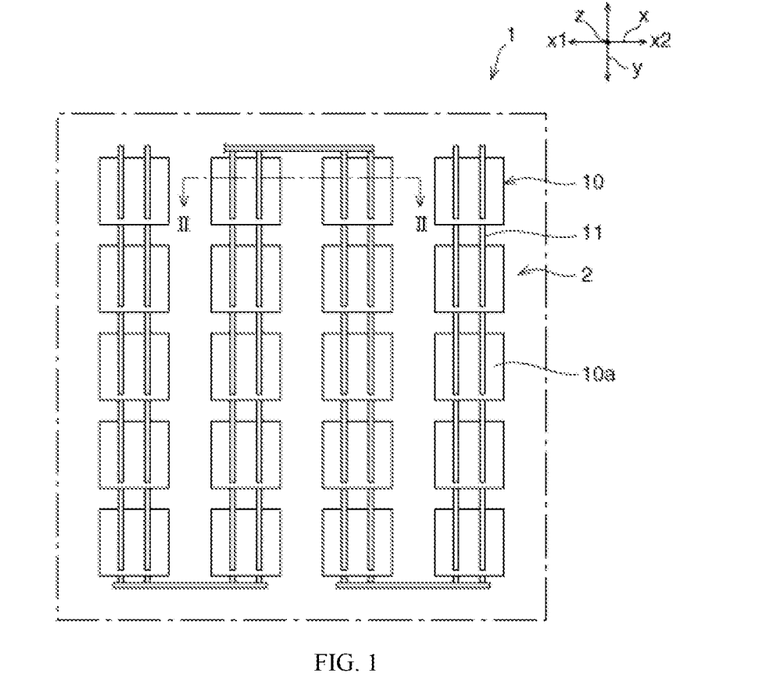
FIG. 1 is a schematic plan view of a solar module according to a first embodiment.
Figure 2:
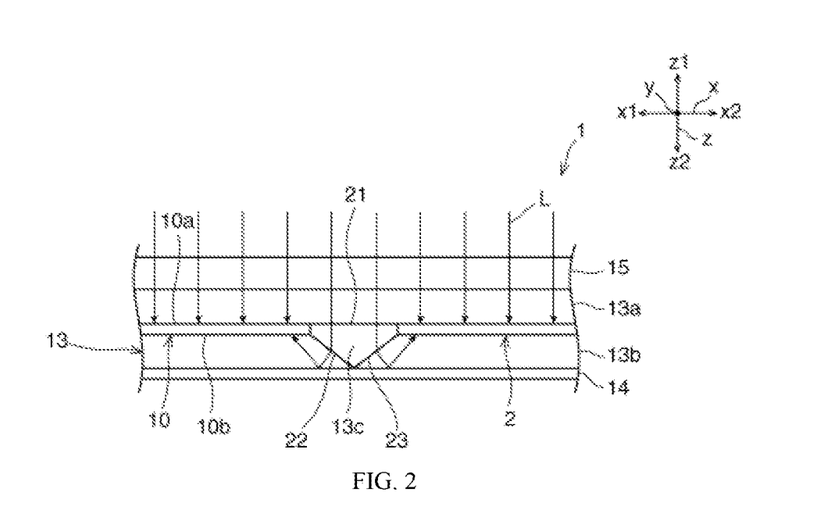
FIG. 2 is a schematic cross-sectional view from line II-II in FIG. 1.

FIG. 1 is a schematic plan view of a solar module according to a first embodiment. FIG. 2 is a schematic cross-sectional view from line II-II in FIG. 1.

The solar module 1 is provided with a plurality of solar cell strings 2. The solar cell strings 2 are arranged at intervals from each other in one direction (the x direction). A solar cell string 2 has a plurality of solar cells 10. In a solar cell string 2, the solar cells 10 are arranged at intervals from each other in a direction (the y direction) perpendicular to the previous direction (x direction). Thus, the solar cells 10 in the solar module 1 are arranged in a matrix in both the x direction and the y direction. The solar cells 10 constituting the solar cell strings 2 are connected electrically by wiring material 11. The wiring material 11 and the solar cells 10 can be bonded using a resin adhesive or solder.

Each solar cell 10 has a light-receiving surface 10a and a back surface 10b. Here, the main surface on which light L is directly incident is the light-receiving surface 10a, and the other main surface is the back surface 10b. However, each solar cell 10 can receive light and generate electricity on both the light-receiving surface 10a and the back surface 10b. In other words, the solar cells 10 are bifacial light-receiving solar cells.

There are no particular restrictions on the solar cells 10 as long as they are bifacial light-receiving solar cells that receive light and generate electricity on both surfaces. The solar cells 10 can be single-crystal silicon solar cells, polycrystalline silicon solar cells, thin-film silicon solar cells, compound semiconductor solar cells, dye-sensitized solar cells, and organic thin-film solar cells.

A transparent member 15 is arranged on the light-receiving surface side (z1 side) of the solar cells 10. A weather-resistant member 14 is arranged on the back surface side (z2 side) of the solar cells 10. A bonding layer 13 is provided between the transparent member 15 and the weather-resistant member 14. The solar cells 10 are sealed in a bonding layer 13. The bonding layer 13 and the transparent member 15 allow light with a wavelength contributing to the generation of electricity in the solar cells 10 to pass through. The weather-resistant member 14 is resistant to the outside environment and is arranged on at least on the side opposite that of the solar cells 10. However, the weather-resistant member 14 also reflects light with a wavelength contributing to the generation of electricity in the solar cells 10 on at least the side facing the solar cells 10.

There are no particular restrictions on the constituent materials of the transparent member 15 and the weather-resistant member 14. The transparent member 15 can be a glass plate or plastic plate. However, the weather-resistant member 14 has to have reflective properties on at least the side facing the solar cells 10. For example, the weather-resistant member 14 can have a multilayer structure of weather-resistant film, reflective film, and light-transmitting film applied in order, respectively, from the side opposite that of the solar cells 10. The weather-resistant member 14 can also have a multilayer structure consisting of weather-resistant film and a reflective layer. The reflective layer can be made of a reflective material such as a metal, metal alloy, or white resin film. An adhesive layer may be provided between the weather-resistant film and the reflective layer, and between the reflective layer and the light-transmitting film. The weather-resistant film, reflective layer and light-transmitting film may have a single-layer structure or a multilayer structure.

The bonding layer 13 has at least two media. More specifically, in the present embodiment, the bonding layer 13 has first through third media 13a, 13b, 13c. The first medium 13a is provided between the solar cells 10 and the transparent member 15 in the thickness direction (z direction) of the solar module 1.

The second medium 13b is provided between the solar cells 10 and the weather-resistant member 14.

The third medium 13c is arranged between adjacent solar cells 10 in the x direction, that is, in the region unoccupied by the solar cells 10. The third medium 13c is provided in the entire region between adjacent solar cells 10 in the x direction. Also, the third medium 13c is arranged so as to extend in the y direction. In the present invention, the third medium 13c may be provided in at least one portion of the region between adjacent solar cells 10 in the x direction.

The plane in which the surface of the third medium 13c facing the transparent member 15 is located is closer to the plane in which the light-receiving surfaces 10a of the solar cells 10 are located than the plane in which the surface of the transparent medium 15 facing the solar cells 10 is located. In the example shown in FIG. 2, the surface of the third medium 13c facing the transparent member 15 is substantially flush with the light-receiving surface 10a of the solar cells 10.

The third medium 13c has an inclined surface that widens in the x direction towards the transparent member 15 and narrows towards the weather-resistant member 14. The inclined surface extends from the back surface 10b of the solar cells 10 towards the weather-resistant member 14 (z2 side). In FIG. 2, the cross-sectional shape of the third medium 13c in the x direction and the z direction is triangular with chamfered base angles.

The first medium 13a and the third medium 13c constitute a first interface 21 positioned between adjacent solar cells 10 in the x direction. The first interface 21 is substantially planar. The first interface 21 is substantially parallel to the light-receiving surface 10a of the solar cells 10.

The third medium 13c and the second medium 13b constitute a second interface 22 and a third interface 23 between adjacent solar cells 10 in the x direction. The second interface 22 is positioned on one side in the x direction (the x1 side), and the third interface 23 is positioned on the other side in the x direction (the x2 side). The second interface 22 extends (in the direction of the x2 side) from the back surface 10b away from the solar cells 10 and towards the side (z2 side) with the weather-resistant member 14. The end portion of the second interface 22 on the x2 side reaches the weather-resistant member 14. The third interface 23 extends (in the direction of the x1 side) from the back surface 10b away from the solar cells 10 and towards the side (z2 side) with the weather-resistant member 14. The end portion of the third interface 23 on the x1 side reaches the weather-resistant member 14. Both the second and the third interfaces 22, 23 are substantially planar.

The solar module 1 satisfies the equation $n_{13b} > n_{13c}$, where $n_{13a}$ is the refractive index of the first medium 13a, $n_{13b}$ is the refractive index of the second medium 13b, and $n_{13c}$ is the refractive index of the third medium 13c. The difference between $n_{13b}$ and $n_{13c}$ ($n_{13b} - n_{13c}$) is preferably equal to or greater than 0.05, and even more preferably equal to or greater than 0.15. There is no particular limitation on the maximum value of the difference between $n_{13b}$ and $n_{13c}$ ($n_{13b} - n_{13c}$), but as an example 0.5 can be used. There is no particular limitation on $n_{13a}$, and it may be equal to or less than $n_{13c}$, between $n_{13c}$ and $n_{13b}$, or equal to or greater than $n_{13b}$.

The value of the refractive index can be the value for any wavelength that can be absorbed by the solar cells 10. For example, a value measured using the monochromatic light of sodium lamps (wavelength: 589.3 nm) can be used.

An ethylene-vinyl acetate (EVA) copolymer is a specific example of a material with a refractive index between 1.49 and 1.53. A polyethylene resin is a specific example of a material with a refractive index between 1.52 and 1.60. A polypropylene resin is a specific example of a material with a refractive index between 1.47 and 1.52. A polymethylmethacrylate resin is a specific example of a material with a refractive index between 1.48 and 1.52. A polyvinylbutyral resin is a specific example of a material with a refractive index between 1.46 and 1.50. A polydimethylsiloxane resin is a specific example of a material with a refractive index between 1.38 and 1.42. Glass is a specific example of a material with a refractive index between 1.43 and 2.1.

The constituent materials of the first through third media 13a-13c can be selected from the materials mentioned above such that $n_{13}b > n_{13c}$.

In the present embodiment, $n_{13b} > n_{13c}$. Therefore, the incident light L perpendicular to the solar module 1 (in the z direction) is refracted at the second interface 22 towards the solar cells 10 (towards the x1 side), reflected on the side with the weather-resistant member 14, and incident on the back surface 10b of the solar cells 10. The light L is also refracted at the third interface 23 towards the solar cells 10 (towards the x2 side), reflected on the side with the weather-resistant member 14, and incident on the back surface 10b of the solar cells 10. In other words, in the present embodiment, second and third interfaces 22, 23 are provided to direct some of the light L incident on the space between adjacent solar cells 10 towards the back surface 10b of the solar cells 10.

However, as described in Patent Document 1, the method used to allow light incident on the gap between adjacent solar cells in the x direction to contribute to the generation of power is to direct the light towards the light-receiving surface of the solar cells by refracting and reflecting the light incident on the gap between the solar cells. In order to direct the light towards the light-receiving surface of the solar cells, the light has to be reflected at least twice. As a result, the optical pass length of the light is lengthened in the bonding layer by the time the light incident on the gap between adjacent solar cells reaches the light-receiving surfaces of the solar cells. Light is absorbed by the bonding layer, and the solar cells experience significant light-collection loss. As a result, it is difficult to adequately improve the photoelectric conversion efficiency.

By contrast, in the present embodiment, second and third interfaces 22, 23 are provided so that at least some of the light L incident on the interfaces 22, 23 in the direction (z direction) perpendicular to the solar module is directed towards the back surface 10b. Therefore, the optical pass length of the light L incident on the gap between adjacent solar cells 10 in the x direction can be shortened in the bonding layer 13 before the light reaches the solar cells 10. Thus, light-collection loss experienced by the solar cells 10 due to light absorption by the bonding layer 13 can be reduced. As a result, a solar module 1 having improved photoelectric conversion efficiency can be realized.

When the ratio of $n_{13b}$ to $n_{13c}$ ($n_{13b}/n_{13c}$) is equal to or greater than 1.15, the refractive power of the second and third interfaces 22, 23 relative to normal incident light L can be increased, and the angle of inclination of the second and third interfaces 22, 23 relative to the x direction can be reduced. This can reduce the distance between the solar cells 10 and the weather-resistant member 14. The result is a thinner solar module 1. In order to further reduce the thickness of the solar module 1, the ratio of $n_{13b}$ to $n_{13c}$ ($n_{13b}/n_{13c}$) is preferably equal to or greater than 1.20.

The first interface 21 is substantially parallel to the transparent member 15. As a result, the normal incident light L is incident on the first interface 21 in a substantially perpendicular direction. As a result, the first interface 21 does not substantially refract the normal incident light L despite the refraction indices $n_{13a}$, $n_{13b}$.

Figure 3:
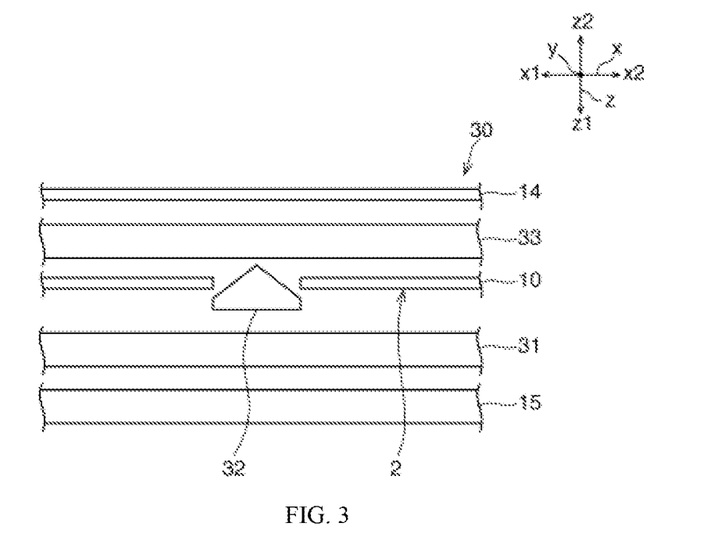
FIG. 3 is an exploded schematic cross-sectional view of the laminate used to create the solar module in the first embodiment.

The solar module 1 can be manufactured in the following manner. First, as shown in FIG. 3, the resin sheet 31 constituting the first medium 13a is positioned on the transparent member 15. Next, the solar cells strings 2 and the column-shaped member 32 constituting the third medium 13c are positioned on the resin sheet 31. Next, the resin sheet 33 constituting the second medium 13b is positioned on the solar cell strings 2 and column-shaped member 32. Finally, the weather-resistant member 14 is positioned on the resin sheet 33. In this way, a stacked body 30 is created which includes the transparent member 15, the resin sheet 31, a plurality of solar cell strings 2, a column-shaped member 32, another resin sheet 33, and a weather-resistant member 14.

This stacked body 30 is heated and crimped in a reduced pressure atmosphere and laminated to complete the solar module 1.

Here, the melt flow rate (MFR) of the column-shaped member 32 is lower than that of the resin sheets 31, 33 at the temperature experienced when the stacked body 30 is heated and crimped (for example, 150° C.). More specifically, the column-shaped member 32 has a higher melt point than the resin sheets 31, 32, and is not substantially deformed when heated and crimped. The column-shaped member 32, for example, may be made of glass. In this way, a solar module 1 with a substantially triangular column-shaped third medium 13c can be obtained.

Other preferred embodiments of the present invention will now be explained. In this explanation, members having substantially the same function as those in the first embodiment are referenced using the same reference numbers and further explanation of these members has been omitted.

2nd Embodiment

Figure 4:
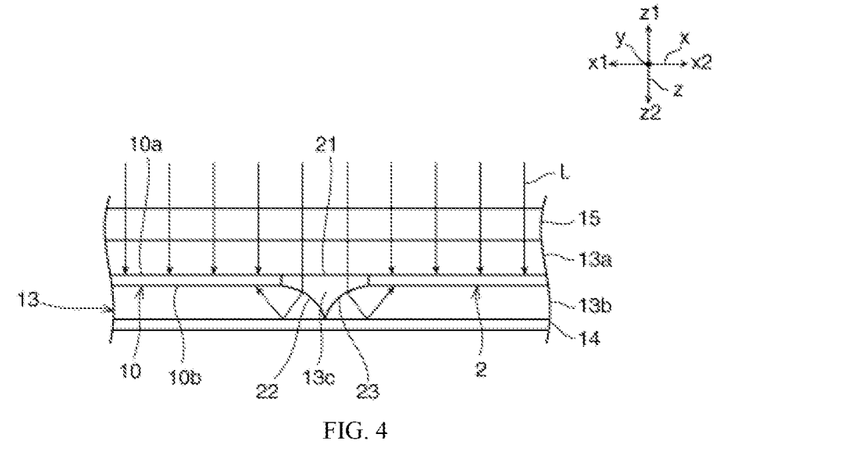
FIG. 4 is a schematic cross-sectional view of a solar module according to a second embodiment.

FIG. 4 is a schematic cross-sectional view of a solar module according to a second embodiment.

In the first embodiment, both the second interface 22 and the third interface 23 were substantially planar. However, the second interface 22 and the third interface 23 may also be curved. In the second embodiment, both the second interface 22 and the third interface 23 are curved so as to protrude towards the side with the transparent member 15 (the z1 side). The second interface 22 and the third interface 23 may also be curved so as to protrude towards the side with the weather-resistant member 14 (the z2 side). In these cases, as in the case of the first embodiment, the light L incident on the space between adjacent solar cells 10 in the x direction can be effectively directed towards the back surface 10b. Therefore, improved photoelectric conversion efficiency can be obtained.

3rd Embodiment

Figure 5:
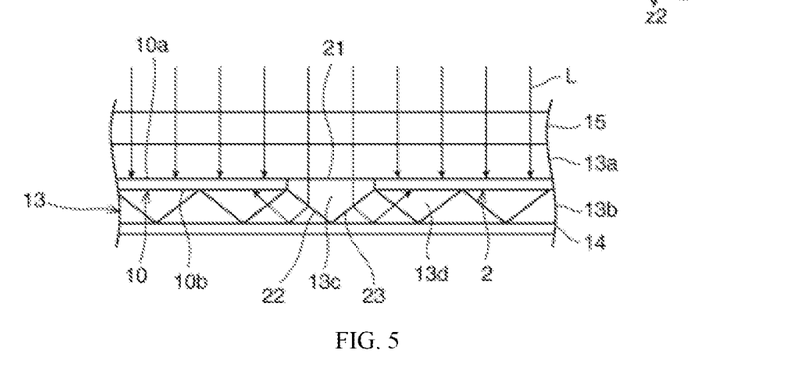
FIG. 5 is a schematic cross-sectional view of a solar module according to a third embodiment.

FIG. 5 is a schematic cross-sectional view of a solar module according to a third embodiment.

In the third embodiment, a plurality of fourth media 13d are provided in the x direction between the back surface 10b of the solar cells 10 and the weather-resistant member 14 along with the second medium 13b and the third medium 13c. The fourth media 13d are arranged between the back surface 10b of the solar cells 10 and the weather-resistant member 14. Each of the fourth media 13d has a triangular column shape extending in the y direction. There are no particular restrictions on the refractive index $n_{13d}$ of the fourth media 13d. It may be the same as the refractive index $n_{13b}$ of the second medium 13b, greater than $n_{13b}$, or smaller than $n_{13b}$.

In the third embodiment, additional media are provided on the bonding layer to create additional interfaces. As in the case of the first embodiment, the light L incident on the space between adjacent solar cells 10 in the x direction can be effectively directed towards the back surface 10b. Therefore, improved photoelectric conversion efficiency can be obtained.

Figure 6:
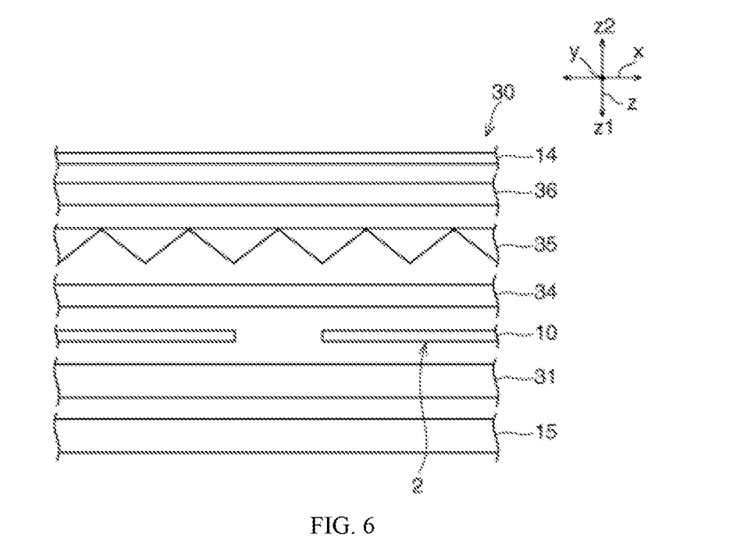
FIG. 6 is an exploded schematic cross-sectional view of the laminate used to create the solar module in the third embodiment.

The solar module in the third embodiment can be manufactured in the following manner. First, as in FIG. 6, the resin sheet 31 constituting the first medium 13a is positioned on the transparent member 15. Next, solar cell strings 2 are positioned on the resin sheet 31. Next, the resin sheet 34 constituting the third medium 13c and fourth media 13d is positioned on the solar cell strings 2. Next, the member 35 constituting the second medium 13b is positioned on the resin sheet 34. The member 35 has a low MFR when heated and crimped. Finally, the resin sheet 36 used to bond the member 35 to the weather-resistant member 14 is positioned on the member 35, and the weather-resistant member 14 is positioned on the resin sheet 36 to complete the stacked body 30. The stacked body 30 is heated and crimped in a reduced pressure atmosphere and laminated to complete the solar module in the third embodiment.

4th Embodiment

Figure 7:
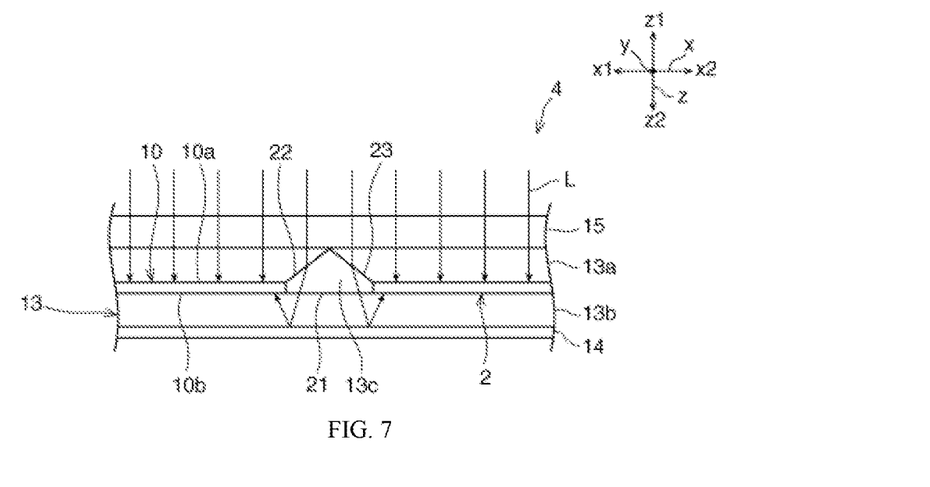
FIG. 7 is a schematic cross-sectional view of a solar module according to a fourth embodiment.

FIG. 7 is a schematic cross-sectional view of a solar module according to a fourth embodiment.

The solar module 4 in the fourth embodiment differs from the solar module 1 in the first embodiment only in that the third medium 13c is arranged on the transparent member 15 side of the back surface 10b of the solar cell 10.

In the fourth embodiment, as in the first embodiment, the third medium 13c is arranged at least in part between the first medium 13a and the second medium 13b, and between adjacent solar cells 10 in the x direction. In the example shown in FIG. 7, the third medium 13c is provided in the entire region between adjacent solar cells 10 in the x direction. The surface of the third medium 13c on the weather-resistant member 14 side (z2 side) is substantially flush with the back surface 10b of the solar cells 10. The third medium 13c also extends to the transparent member 15 side (z1 side) from the back surface of the solar cell 10. The cross-sectional shape of the third medium 13c in the x direction and the z direction is triangular with chamfered base angles.

In the fourth embodiment, the second medium 13b and the third medium 13c form a first interface 21 which is substantially parallel to the transparent member 15. The third medium 13c and the first medium 13a form second and third interfaces 22, 23, respectively, which are positioned between adjacent solar cells 10 in the x direction, that is, in the region unoccupied by the solar cells 10. The second interface 22 is positioned on one side (the x1 side) in the x direction, and the third interface 23 is positioned on the other side (the x2 side) in the x direction. The second interface 22 extends (in the direction of the x2 side) from the light-receiving surface 10a away from the solar cells 10 and towards the side (z1 side) with the transparent member 15. The end portion of the second interface 22 on the x2 side reaches the transparent member 15. The third interface 23 extends (in the direction of the x1 side) from the light-receiving surface 10a away from the solar cells 10 and towards the side (z1 side) with the transparent member 15. The end portion of the third interface 23 on the x1 side reaches the transparent member 15. Both the second and the third interfaces 22, 23 are substantially planar, but are not limited to this arrangement.

In the fourth embodiment, $n_{13c} < n_{13a}$. The difference between $n_{13a}$ and $n_{13c}$ ($n_{13a} - n_{13c}$) is preferably equal to or greater than 0.05, and even more preferably equal to or greater than 0.15. There is no particular limitation on the maximum value of the difference between $n_{13a}$ and $n_{13c}$ ($n_{13a} - n_{13c}$), but 0.5, for example, can be used. The ratio of $n_{13a}$ to $n_{13c}$, ($n_{13a}/n_{13c}$) is equal to or greater than 1.05, and even more preferably equal to or greater than 1.15. There is no particular limitation on the upper limit of the ratio of $n_{13a}$ and $n_{13c}$ ($n_{13a}/n_{13c}$), but for example it can be 1.50. There is no particular limitation on $n_{13b}$, but it may be equal to or less than $n_{13a}$, between $n_{13a}$ and $n_{13c}$, and equal or greater than $n_{13c}$.

In the present embodiment, both the second interface 22 and the third interface 23 extend away from the light-receiving surface 10a of the solar cells 10 towards the transparent member 15, and $n_{13c} < n_{13a}$. Therefore, the light L incident on the solar module 1 is refracted towards the solar cells 10 on the second interface 22 side (the x1 side), reflected on the weather-resistant member 14 side, and is incident on the back surface 10b of the solar cells 10. Also, the light L is refracted on the solar cell 10 side (x2 side), reflected on the weather-resistant member 14 side, and incident on the back surface 10b of the solar cells 10. In other words, in the present embodiment, a second interface 22 and a third interface 23 are provided such that at least some of the light L incident on the second and the third interfaces 22, 23 from the perpendicular direction (z direction) relative to the solar module 1 is directed towards the back surface 10b.

Therefore, the solar module 4 in the fourth embodiment has excellent photoelectric conversion efficiency similar to that of the solar module 1 in the first embodiment.

When the ratio of $n_{13a}$ to $n_{13c}$ ($n_{13a}/n_{13c}$) is equal to or greater than 1.15, the refractive power of the second and third interfaces 22, 23 relative to normal incident light L can be increased, and the angle of inclination of the second and third interfaces 22, 23 relative to the x direction can be reduced. The result is a thinner solar module 4. In order to further reduce the thickness of the solar module 4, the ratio of $n_{13a}$ to $n_{13c}$ ($n_{13a}/n_{13c}$) is preferably equal to or greater than 1.20.

The fourth solar cell 4 can be completed by heating and crimping and laminating a stacked body similar to the stacked body 30 shown in FIG. 3 in a reduced pressure atmosphere. However, in the fourth solar cell 4, the orientation of the column-shaped member 32 does not differ by 180°.

5th Embodiment

Figure 8:
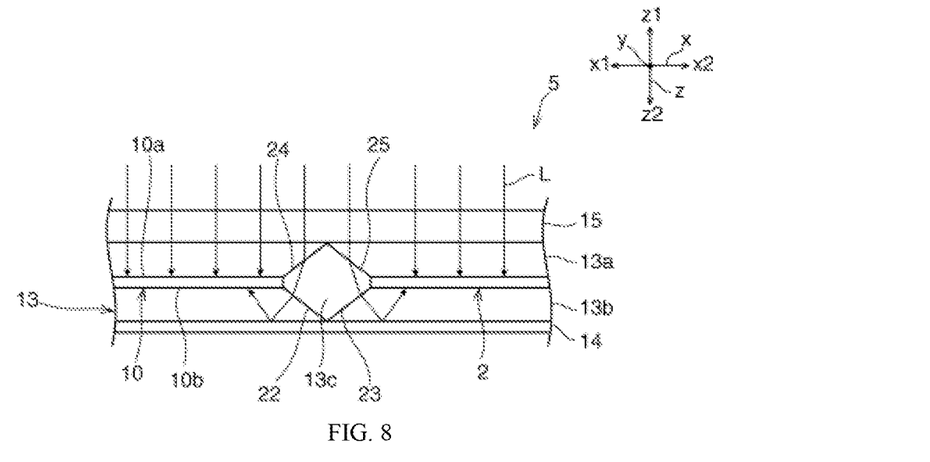
FIG. 8 is a schematic cross-sectional view of a solar module according to a fifth embodiment.

FIG. 8 is a schematic cross-sectional view of a solar module according to a fifth embodiment.

The configuration of the solar module 5 in the fifth embodiment is similar to that of the first solar module 1 in the first embodiment except for the shape of the third medium 13c.

In the fifth solar module 5, the third medium 13c has a square column shape in which a pair of corners in the x direction has been chamfered. The third medium 13c and the second medium 13b constitute a second interface 22 and a third interface 23. The third medium 13c and the first medium 13a constitute a fourth interface 24 and fifth interface 25. The fourth interface 24 is positioned on one side in the x direction (the x1 side), and the fifth interface 25 is positioned on the other side in the x direction (the x2 side). The fourth interface 24 extends (in the direction of the x2 side) away from the solar cells 10 and towards the light-receiving surface (z1 side). The end portion of the fourth interface 24 on the x2 side reaches the transparent member 15. The fifth interface 25 extends (in the direction of the x1 side) away from the solar cells 10 and towards the light-receiving surface (z1 side). The end portion of the fifth interface 25 on the x1 side reaches the transparent member 15. Both the fourth and the fifth interfaces 24, 25 are substantially planar.

In the fifth embodiment, $n_{13b} > n_{13c} < n_{13a}$. The difference between $n_{13a}$ and $n_{13c}$ ($n_{13a} - n_{13c}$) is preferably equal to or greater than 0.05, and even more preferably equal to or greater than 0.15. There is no particular limitation on the maximum value of the difference between $n_{13a}$ and $n_{13c}$, ($n_{13a} - n_{13c}$), but 0.5, for example, can be used. Similarly, the difference between $n_{13b}$ and $n_{13c}$ ($n_{13b} - n_{13c}$) is preferably equal to or greater than 0.05, and even more preferably equal to or greater than 0.15. There is no particular limitation on the maximum value of the difference between $n_{13b}$ and $n_{13c}$ ($n_{13b} - n_{13c}$), but 0.5, for example, can be used.

The ratio of $n_{13a}$ to $n_{13c}$ ($n_{13a}/n_{13c}$) is equal to or greater than 1.05, and preferably equal to or greater than 1.15. There is no particular limitation on the upper limit of the ratio of $n_{13a}$ and $n_{13c}$ ($n_{13a}/n_{13c}$), but for example it can be 1.50.

The ratio of $n_{13b}$ to $n_{13c}$ ($n_{13b}/n_{13c}$) is preferably equal to or greater than 1.05, and even more preferably equal to or greater than 1.15. There is no particular limitation on the upper limit of the ratio of $n_{13b}$ and $n_{13c}$ ($n_{13b}/n_{13c}$), but for example it can be 1.50.

In the fifth embodiment, the second through fifth interfaces 22-25 are provided to direct at least some of the light L incident on the fourth and fifth interfaces 24, 25 from the direction (z direction) perpendicular to the solar module 1 towards the back surface 10b. Therefore, the solar module 5 in the fifth embodiment has excellent photoelectric conversion efficiency similar to that of the solar module 1 in the first embodiment.

When the ratio of $n_{13c}$ to $n_{13a}$ ($n_{13c}/n_{13a}$) is equal to or greater than 1.15 and the ratio of $n_{13b}$ to $n_{13c}$ ($n_{13b}/n_{13c}$) is equal to or greater than 1.20, the refractive power of the second through fifth interfaces 22-25 relative to normal incident light L can be increased, and the angle of inclination of the second through fifth interfaces 22-25 relative to the x direction can be reduced. The result is a thinner solar module 5. In order to further reduce the thickness of the solar module 4, the ratio of $n_{13c}$ to $n_{13a}$ ($n_{13}/n_{13a}$) is preferably equal to or greater than 1.15, and the ratio of $n_{13b}$ to $n_{13c}$ ($n_{13b}/n_{13c}$) is preferably equal to or greater than 1.20.

The present invention includes many other embodiments not described herein. For example, interfaces may be provided between adjacent solar cells in a solar cell string 2 whose direction of array is the y direction in order to direct light incident on solar cells adjacent in the y direction towards the back surface of the solar cells. Also, the bonding layer 13 may include two media or four or more media. The planar shape of the solar cells 10 may also be a rectangular shape having four corners that have been chamfered or round chamfered. The solar cells 10 may also be back contact solar cells. Thus, the present invention includes many other embodiments not described herein. Therefore, the technical scope of the present invention is defined solely by the items specified in the claims.

1, 4, 5: Solar module
10: Solar cell
10a: Light-receiving surface
10b: Back surface
13: Bonding layer
13a: First medium
13b: Second medium
13c: Third medium
13d: Fourth medium
14: Weather-resistant member
15: Transparent member
21: First interface
22: Second interface
23: Third interface
24: Fourth interface
25: Fifth interface

What is claimed is:

1. A solar module comprising:
   a bifacial light-receiving solar cell,
   a transparent member that reflects light arranged on the light-receiving surface side of the solar cell,
   a weather-resistant member arranged on the back surface side of the solar cell, and
   a bonding layer arranged in a space between the transparent member and the weather-resistant member; wherein
   the bonding layer including at least two media with different refractive indices, interfaces are formed by at least two media and are positioned in a region unoccupied by the solar cells, and
   the interfaces being configured such that at least some of the light that is incident on the interfaces in a direction perpendicular to the solar module is refracted at the interfaces towards the solar cells, reflected on the weather-resistant member, and guided to the back surface of the solar cells.

2. The solar module according to claim 1, wherein the interface extends from the back surface of the solar cell away from the solar cell and towards the weather-resistant member; and the medium positioned on the weather-resistant member side of the interface has a refractive index that is higher than the refractive index of the medium positioned on the transparent member side of the interface.

3. The solar module according to claim 1, wherein the interface extends from the light-receiving surface of the solar cell away from the solar cell and towards the transparent member; and the medium positioned on the weather-resistant member side of the interface has a refractive index that is lower than the refractive index of the medium positioned on the transparent member side of the interface.

4. The solar module according to claim 1, wherein the interface includes a first interface extending from the back surface of the solar cell away from the solar cell and towards the weather-resistant member, and a second interface extending from the light-receiving surface of the solar cell away from the solar cell and towards the transparent member;
   the medium positioned on the weather-resistant member side of the first interface having a refractive index that is higher than the refractive index of the medium positioned on the transparent member side of the first interface, and
   the medium positioned on the transparent member side of the second interface having a refractive index that is higher than the refractive index of the medium positioned on the weather-resistant member side of the second interface.

5. The solar module according to claim 1, wherein the difference in the refractive indices of the two media constituting the interface is equal to or greater than 1.05.

* * * * *